(12) United States Patent
Khabbaz et al.

(10) Patent No.: US 6,351,183 B1
(45) Date of Patent: Feb. 26, 2002

(54) SWITCHED AMPLIFYING DEVICE

(75) Inventors: Brian Khabbaz, Windham, NH (US); Wayne Mack Struble, Franklin, MA (US); Michael T. Murphy, Hudson, NH (US); Kevin Harrington, Arlington, MA (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/564,019

(22) Filed: May 3, 2000

Related U.S. Application Data

(63) Continuation of application No. 08/960,903, filed on Oct. 30, 1997.

(51) Int. Cl.[7] ............................................. H03F 1/14
(52) U.S. Cl. ...................................... 330/51; 330/151
(58) Field of Search ............................ 330/51, 151, 86, 330/110, 302, 310, 124 D

(56) References Cited

U.S. PATENT DOCUMENTS

| | | | |
|---|---|---|---|
| 5,008,631 A | * 4/1991 | Scherer et al. ............... | 330/51 |
| 5,175,871 A | 12/1992 | Kunkel .......................... | 455/69 |
| 5,507,023 A | 4/1996 | Suganuma et al. ........... | 455/234 |
| 5,530,402 A | 6/1996 | Wright .......................... | 330/51 |
| 5,548,246 A | 8/1996 | Yamamoto et al. ........... | 330/51 |
| 5,570,064 A | 10/1996 | Sugawara ..................... | 330/282 |
| 5,627,857 A | 5/1997 | Wilson ......................... | 375/219 |
| 5,661,434 A | * 8/1997 | Brozovich et al. ............ | 330/51 |
| 5,661,437 A | * 8/1997 | Nishikawa et al. ........... | 330/282 |
| 5,774,017 A | * 6/1998 | Adar ............................. | 330/51 |
| 5,905,643 A | * 6/1999 | Aihara .......................... | 330/51 |
| 6,118,989 A | * 9/2000 | Abe et al. ...................... | 330/51 |
| 6,121,841 A | * 9/2000 | Sakuno ......................... | 330/302 |

OTHER PUBLICATIONS

M. Cardullo et al., Transmitter Chips For Use In A Dual-Mode AMPS/CDMA Chip Set, Microwave Journal, Mar. 1996, pp. 60–72.

* cited by examiner

*Primary Examiner*—Robert Pascal
*Assistant Examiner*—Khanh V. Nguyen

(57) ABSTRACT

A switched amplifying device for use in a wireless telecommunications receiver as an amplifier of an RF signal has an amplifying device electrically connected in parallel with a switch. The switched amplifying device has a bypass mode in which an electrical path of the RF signal bypasses the amplifying device and is connected to an RF output port. The switched amplifying device also has an amplification mode in which the electrical path of the RF signal flows through the amplifying device prior to presentation of the RF signal at the RF output. In the bypass mode, the amplification device is in an off state. Similarly, in the amplification mode, the bypass device is in an off state. Use of the switched amplifying device according to the teachings of the present invention in a receiver permits accommodation of a larger dynamic range in amplitude of received signal with less signal degradation and noise figure than in prior art amplification devices.

39 Claims, 5 Drawing Sheets

SWITCHED AMPLIFYING DEVICE

REFERENCE TO RELATED APPLICATIONS

This application is a continuation of U.S. patent Ser. No. 08/960,903 filed Oct. 30, 1997.

FIELD OF THE INVENTION

The teachings of the present invention relate to an amplifying device having a bypass mode and an amplifying mode of operation.

BACKGROUND OF THE INVENTION

Amplifiers are frequently used in communications applications, and specifically wireless telecommunications. By way of example, mobile phones for wireless communications require high performance amplifiers as part of a receiver and transmitter circuitry. A function of the amplifier is to accept the signal transmitted by a base station, perform an adjustment so that the maximum amplitude frequency component of the signal falls within a predetermined optimum range, and relay the signal to decoding circuitry. Accordingly, it is desirable for the amplifying device to perform its function without degradation of the received signal. In particular, it is desirable for the amplifying device to have low noise figure and high linearity. It is further desirable for the amplifying device to be able to perform its function over a large dynamic range in signal amplitude. An ability to receive signals over a large dynamic range enables the mobile phone receiver to accommodate both near and far transmitted signals as well as to accommodate and receive desired small amplitude signals in the presence of high amplitude jamming or interfering signal. Achieving a high degree of amplifier linearity at over a large dynamic range presents a technical challenge in the prior art. Conventionally, therefore, a switched amplifying device for use in a wireless telecommunications receiver may have a bypass mode and an amplifying mode and two single pole double throw switches at the input and output of the amplifier to select the appropriate gain mode for use at any point in time. The bypass mode for purposes of the present patent application is defined as either a direct through connection having little loss and no amplification or a fixed or variable attenuation stage. Specifically, the bypass mode is used when the amplitude of the received signal is relatively high. For a received signal of significant amplitude, it is undesirable to further amplify the signal because the amplified signal will be out of the optimum signal amplitude range of the circuitry. Accordingly, the bypass mode is appropriate when low loss, low noise figure, and high linearity are desirable features. For a weak received signal, it is desirable to amplify the signal to place the signal within the optimum signal amplitude range of the circuitry. For the amplifying mode, high gain, high linearity, and low noise figure are desirable features.

In order to achieve the desired features, conventionally, a switched amplifying device is placed in series with a first and second single pole, double throw switch (3,4), as shown in FIG. 1 of the drawings. For the bypass mode, each switch connects an RF input port (1) to an RF output port (2) through a bypass circuit (5). For the amplification mode, each switch (3,4) toggles to connect the RF input port (1) to the RF output port (2) through a switched amplifying device (6). Disadvantageously, in the bypass mode the series switches (3,4) cause some signal loss and increase the noise figure before the signal is amplified, thereby reducing the overall receiver system sensitivity. Disadvantageously, in the amplification mode, the series switches (3,4) increase the noise figure of the overall amplifying system, and consequently the receiver system, due to the switch loss at the input of the switched amplifying device.

There is a need, therefore, to further reduce the system noise figure in the amplifying device while increasing the dynamic range over which the amplifying device operates.

SUMMARY OF AN EMBODIMENT OF THE INVENTION

It is an object of an embodiment of the invention to provide an amplifying device having a low noise figure.

It is another object of an embodiment of the invention to provide an amplifying device capable of receiving and processing RF signals over a wide dynamic range in received signal amplitude.

An amplifying device disposed between an RF input and an RF output having an amplification mode and a bypass mode comprises an amplifying FET. The amplifying FET is electrically disposed in parallel with a bypass device. The amplifying FET has an on state in the amplification mode and an off state in a bypass mode.

It is a feature of an embodiment of the present invention that the amplifying FET draws no supply current in the bypass mode.

It is a feature of an embodiment of the present invention that an amplifying device is electrically connected in parallel with a bypass device.

It is a feature of an embodiment of the present invention that an amplifying FET has an on state in the amplification mode and an off state in the bypass mode.

It is a feature of an embodiment of the present invention that the bypass device may comprise a bypass switch or an attenuator.

It is a feature of an embodiment of the present invention that the bypass switch has an off state in the amplification mode and an on state in the bypass mode.

It is an advantage of an embodiment of the present invention that an amplifying device has a lower noise figure than prior art amplification devices having a similar amplitude dynamic range.

It is an advantage of an embodiment of the present invention that a switch is eliminated at an input port of an amplification device and, therefore, does not affect performance of the amplifier's amplification mode.

BRIEF DESCRIPTION OF THE DRAWINGS

Embodiments of the invention are now described by way of example with reference to the following Figures in which.

DETAILED DESCRIPTION OF EMBODIMENTS OF THE INVENTION

Figures 1, 2, 3:
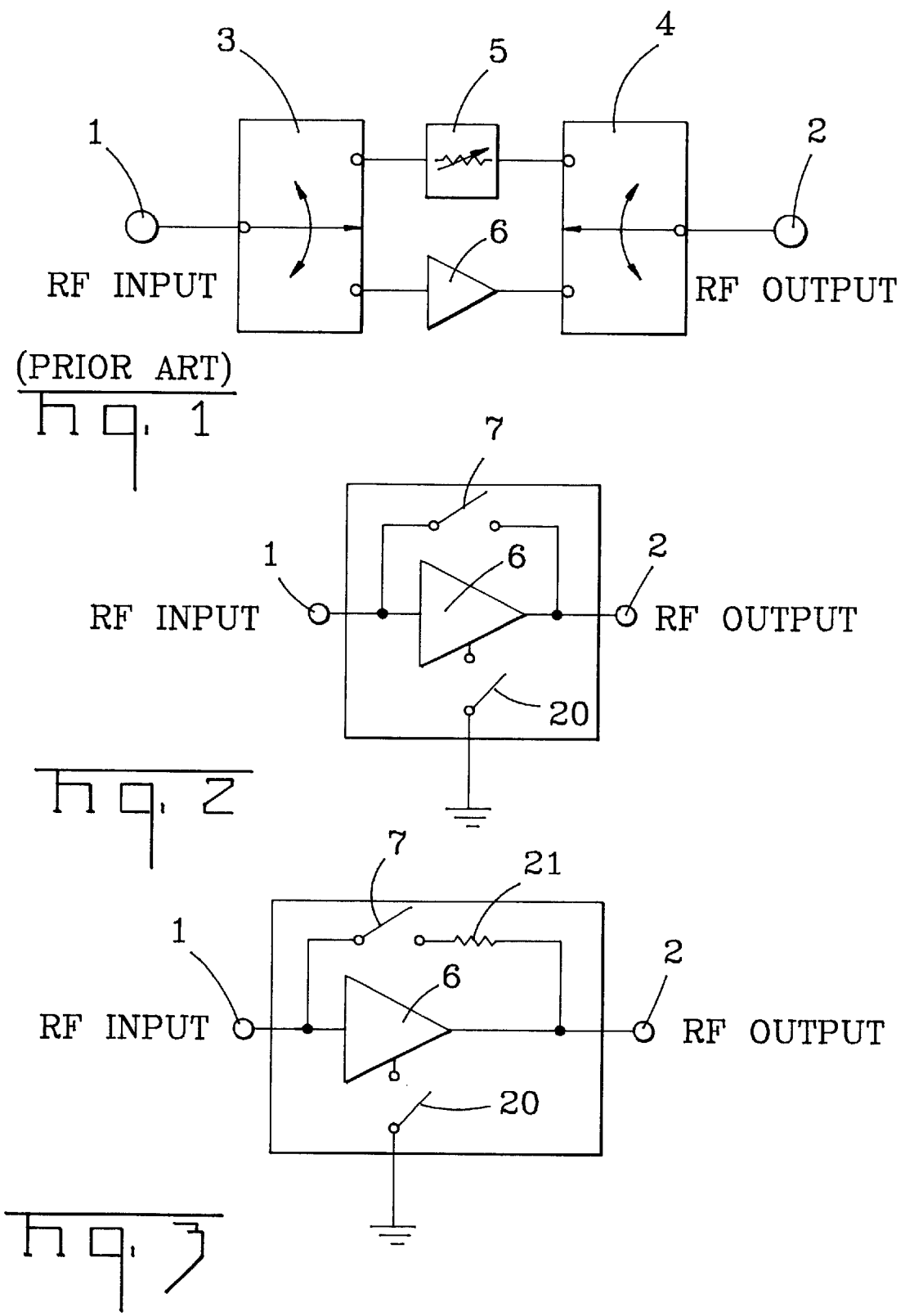
FIG. 1 is a functional block diagram of a conventional receiver subsection employing a switched amplifying device.
FIG. 2 is a functional block diagram of a receiver subsection employing a switched amplifying device having a bias current cutoff switch and connected in parallel with a bypass switch according to one embodiment of the present invention.
FIG. 3 is a functional block diagram of a receiver subsection employing a switched amplifying device having a bias current cutoff switch and connected in parallel with an attenuation stage according to one embodiment of the present invention.

With specific reference to FIGS. 2 and 3 of the drawings, there is shown a functional diagram of a switched amplifying device (6) with a bypass device (7) electrically connected in parallel. The bypass device (7) can be a switch alone with a direct through connection when it is closed and having minimum loss, or can include a fixed or variable attenuation stage (27). Advantageously, a series switch is not present at the RF input (1) of the switched amplifying device (6) thereby not adversely affecting the performance of the amplifying device and not adding to the noise figure of the overall amplifying system. This is particularly advantageous in a CDMA communications system receiver sensitivity and for receiver and transmitter current efficiency. The switched amplifier further has a bias current control switch (20) that turns the amplifier (6) off when the bypass switch (7) is on, as in the bypass mode, and turns the amplifier on when the bypass switch (7) is off, as in the amplification mode. Also shown in FIG. 3 is the use of the attenuation stage (27), which is shown in the form of a resistor, in the bypass path of the amplifying device.

Figure 4:
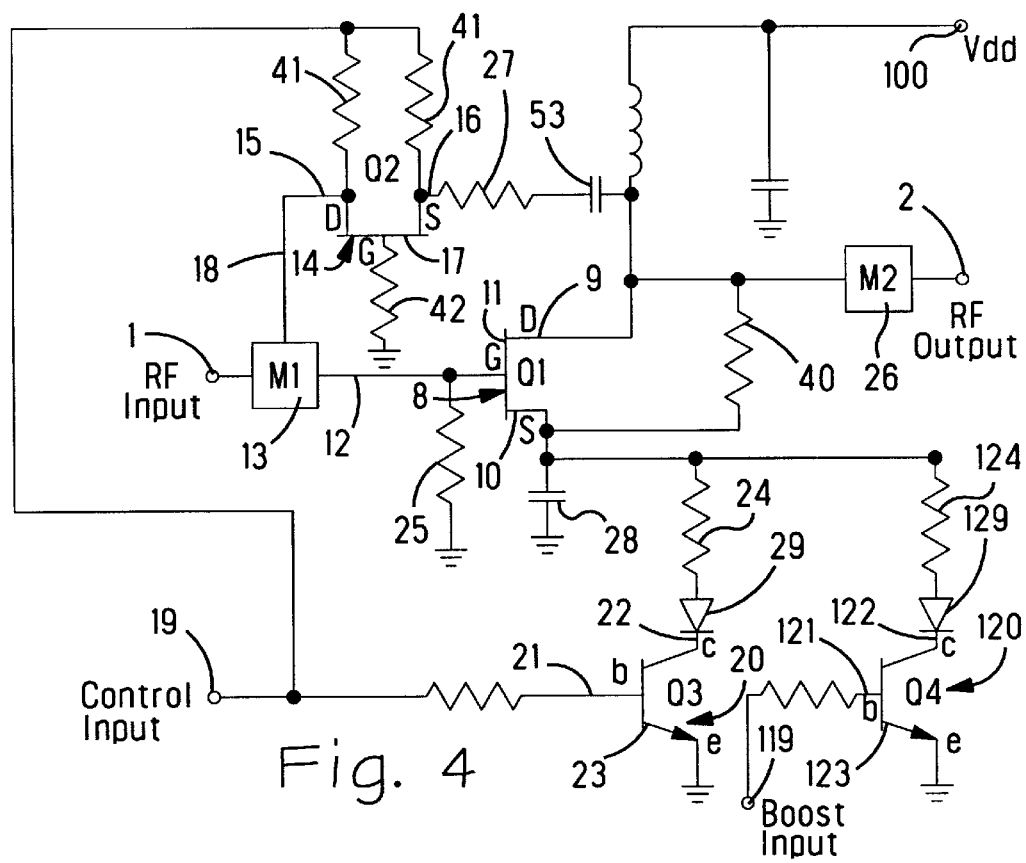
FIG. 4 is a partial schematic of a switched amplifying device according to the teachings of the present invention.

With specific reference to FIG. 4, there is shown a switched amplifying device having an RF input port (1) and an RF output port (2). The switched amplifying device comprises a depletion mode GaAs MESFET as an amplifying FET (8) having a drain (9), source (10), and gate (11). The nomenclature for purposes of the present patent application referring to "drain" and "source" of an FET device refer to the direction of current flow, specifically current flow from drain to source. In a GaAs MESFET, the physical structure of the drain and source of the device are identical and may be interchanged. The gate (11) of the amplifying FET (8) is connected to an amplifying path output port (12) of a first impedance matching network (13). The amplifying FET (8) is electrically disposed in parallel with a bypass device comprising a depletion mode GaAs MESFET as a bypass FET (14) having a drain (15), source (16), and gate (17). The source (16) of the bypass FET (14) is connected to the drain (9) of the amplifying FET (8) through an attenuation resistor (27) in series with a DC blocking capacitor (53). The attenuation resistor (27) may have a value between 0 ohms and 40 ohms depending upon the desired amount of attenuation. The DC blocking capacitor (53) has a value of approximately 1pF. The drain (15) of the bypass FET (14) is connected to a bypass path output port (18) of the impedance matching network (13). A control input (19) is connected to the drain (15) and source (16) of the bypass FET (14) through pull-up resistors (41) having a value of approximately 10 kohms. The gate (17) of the bypass FET (14) is connected to reference potential (101) through a pull-down resistor (42) having a value of approximately 10 kohms. The control input (19) accepts a switched DC signal of either 0 volts equal to reference potential (101) or Vdd volts equal to a biasing potential (100) to place the switched amplifying device in either the bypass mode or the amplification mode. The gate (11) of the amplifying FET (8) is biased at reference potential (101) through amplifying FET biasing resistor (25). Control switch (20) in the embodiment disclosed comprises a bipolar junction NPN transistor having a base (21), emitter (23), and collector (22). The control input (19) is connected to the base (21) of the control switch (20) through a 10 kohm resistor as well as the drain (15) and source (16) of the bypass FET (14), also through 10 kohm pull up resistors (41). The collector (22) of the control switch (20) is connected to the source (10) of the amplifying FET (8) through a bias current setting resistor (24) and temperature compensation diode (29). The value of the bias current setting resistor (24) sets the bias current of the amplifying FET (8) when it is in the on state during the amplification mode. The temperature compensation diode (29) provides a certain amount of temperature compensation for the amplifying circuit. Under operation without a temperature compensation diode (29), as ambient temperature rises, the transconductance of the amplifying FET decreases, causing a drop in gain for the amplifying device. In order to maintain a more constant gain value over the operating temperature range, the temperature compensation diode (29) is placed in series with the bias current setting resistor (24). As ambient temperature for the device rises, the constant voltage drop across the temperature compensation diode (29) decreases. This increases the voltage drop across the bias current setting resistor (24) which also increases the current flowing through the amplifying FET (8). The increase in current flow results in an increase in gain to compensate for the loss in gain resulting from the ambient temperature rise. The circuit configuration shown in FIG. 4 uses depletion mode GaAs MESFETs for the amplifying (8) and bypass FETs (14) and a silicon based NPN bipolar junction transistor for the control switch (20). For practical reasons, the amplifying and bypass FETs (8,14) with the related passive circuitry preferably occupy the same integrated circuit die, while the control switch (20) is external to the IC die.

In operation, the amplifying FET (8) has an on state in the amplification mode and an off state in the bypass mode.

Figure 5:
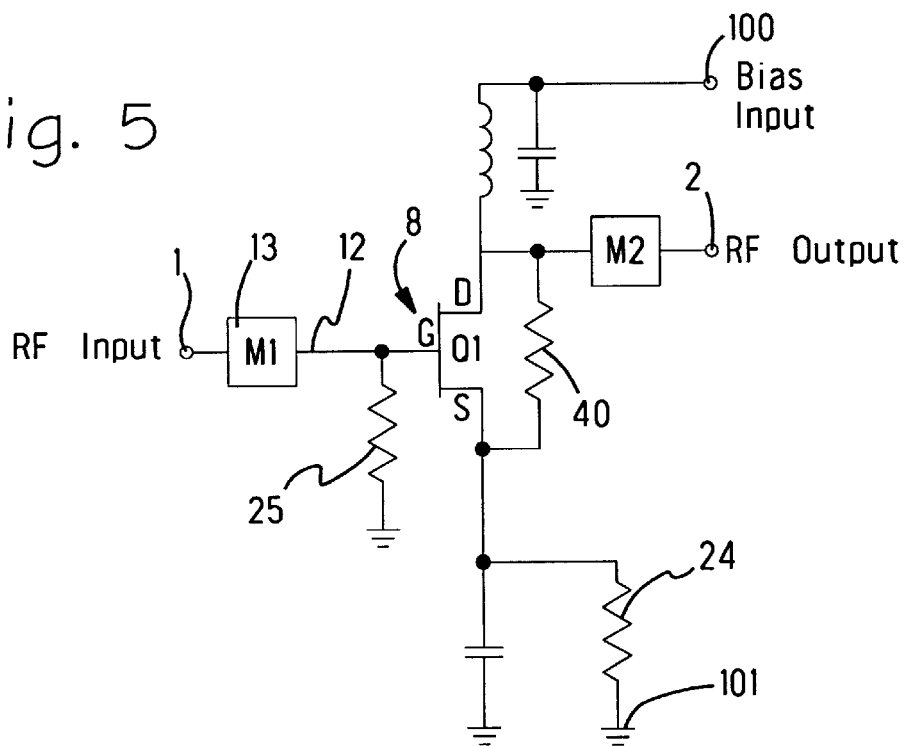
FIG. 5 is a schematic representation of an equivalent circuit of an amplification mode in a switched amplifying device according to the schematic shown in FIG. 4 of the drawings.

With specific reference to FIG. 5 of the drawings, there is shown an equivalent circuit for the amplification mode of a switched amplifying device according to the teachings of the present invention. In the amplification mode, control input (19) is at biasing potential (100). When the control switch (19) is on, RF current is permitted to flow through the amplifying FET (8). The control input (19) at biasing potential also biases the drain (15) and the source (16) of the bypass FET (14) to biasing potential. As the gate (17) of the bypass FET (14) is pulled to reference potential (101), the bypass FET is in its pinch-off or off state. The bypass FET (14) in the off state is an effective open circuit and may be effectively removed from the equivalent circuit. The control switch (20) in the on state is an effective short circuit. As the gate (11) of the amplifying FET (8) is pulled to reference potential (101) through amplifying FET biasing resistor (25), the control switch (20) turns the amplifying FET on by connecting the source (10) to reference potential (101). Accordingly, the source (10) of the amplifying FET (8) is represented in the equivalent circuit for the amplification mode as connected to reference potential (101) through the bias current setting resistor (24). With the source (10) of the amplifying FET (8) connected to reference potential (101) and the gate (11) of the amplifying FET (8) pulled to reference potential through amplifying FET biasing resistor (25), the amplifying FET (8) is placed in an on or amplification state and RF current flow through the amplifying device can occur. A received RF signal present at the RF input (1) passes through the impedance matching network (13) to appear at the amplification path output port (12) and the gate (11) of the amplifying FET (8) which generates an amplified RF signal at the drain (9) of the amplifying FET (8). The amplified RF signal appears at the drain (9) of the amplifying FET (8) and is connected to the RF output port (2) through second impedance matching network (26). Accordingly, the control input at biasing potential (100), Vdd, concurrently places the bypass device in an off state and the amplifying FET (8) in the on or amplification state permitting amplification without having the RF signal pass through a switch.

Figure 7:
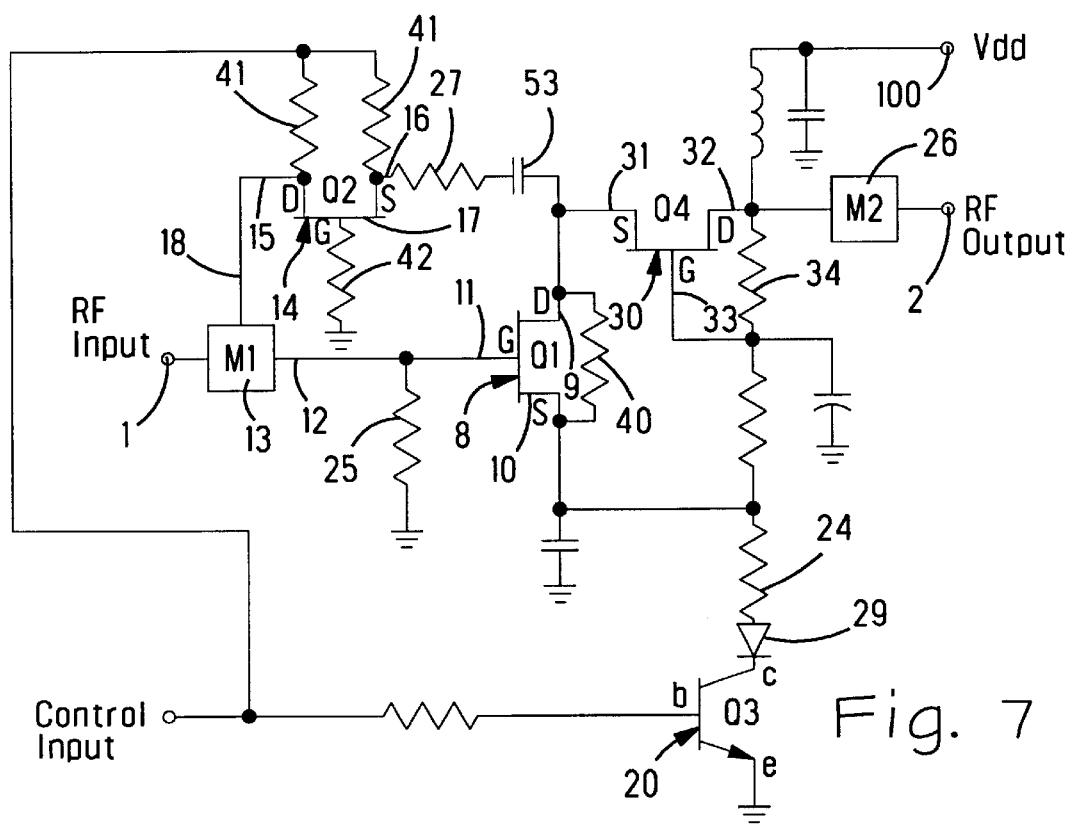
FIG. 7 is a partial schematic of an alternate embodiment of a switched amplifying device according to the teachings of the present invention.
Figure 6:
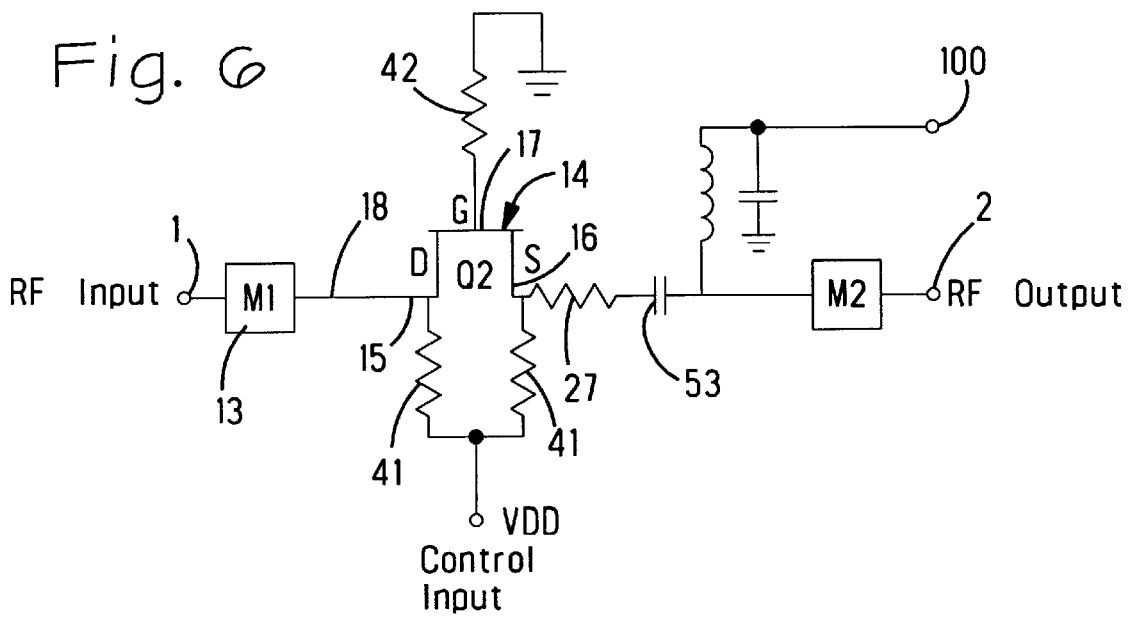
FIG. 6 is a schematic representation of an equivalent circuit of a bypass mode in a switched amplifying device according to the schematic shown in FIG. 4 of the drawings.

With specific reference to FIGS. 6 and 7 of the drawings, there is shown an equivalent circuit for the bypass mode of an embodiment of a switched amplifying device according to the teachings of the present invention. In the bypass mode, the control input (19) is at reference potential (101) which biases the source (16) of the bypass FET (14) at reference potential (101). The gate (17) of the bypass FET is pulled to reference potential (101). This results in a zero voltage differential between the gate (17) and source (16) of the bypass FET (14) thereby placing the bypass FET (14) in an on state. The control input (19) at reference potential (101) also appears at the base (21) of the control switch (20) placing it in an off state. The control switch (20) in an off state effectively opens the source (10) of the amplifying FET (8), turning it off, thereby preventing DC and RF current flow through it. A large valued amplifying FET pull up resistor (40) having a value of 10 kohms for example, ensures that the amplifying FET (8) is off when the control switch (20) is open. The amplifying FET (8), therefore, may be effectively removed from the equivalent circuit of the amplifying device when it is in the bypass mode. The bypass FET (14) in an on state is an effective short circuit wherein the RF signal flows from the RF input port (1) through the first impedance matching network (13) to the bypass path output port (18). The RF signal flows through the bypass FET (14) by virtue of its on or current conducting state and to the RF output port (2) through the second impedance matching network (26). Accordingly, the received RF signal presented to the RF input port (1) when the switched amplifying device is in the bypass mode, passes through the bypass FET (14) and to the RF output port (2) without amplification. Optionally, the bypass mode may include an amount of attenuation from attenuation resistor (27) in series with the bypass FET (14) having a value of anything from 0 ohms to 40 ohms depending upon the degree of desired attenuation. Another option comprises a "boost mode" where the amount of DC current flow through the amplifying FET may be increased for improved linearity at the expense of current efficiency. In the boost mode, and with specific reference to FIG. 4 of the drawings, there is a series combination circuit comprising resistor (124), diode 129, and boost switch (120) having a collector (122), a base (121), and an emitter (123). The series combination circuit is connected in parallel with the bias current resistor (24), temperature compensation diode (29) and control switch (20). The base (121) is coupled to a boost input (119). The emitter (123) is connected to reference potential (101). The boost input (119) provides a DC signal having a value of either reference potential (101) or bias potential (100) to turn the boost switch on or off as appropriate. When the boost switch is turned on, an increased amount of DC current conducts through the amplifying FET (8). Accordingly, gain linearity of the amplifying FET (8) is improved.

The first impedance matching network (13) has an input at the RF input (1) and two outputs, the amplification path output port (12) and the bypass path output port (18). In the amplification mode, the electrical path of the received RF signal flows from the RF input (1) to the amplification path output port (12) between which there may be impedance elements configured to match the gate (11) of the amplifying FET (8) to an appropriate input impedance, typically 50 ohms. Any impedance elements in the path of the received signal for the amplification mode may be optimized for minimum loss in order to maximize the overall receiver system sensitivity and are also taken into consideration when a certain amount of attenuation is desired for the bypass mode. In the bypass mode, the RF electrical path of the received RF signal flows from the RF input (1) to the bypass path output port (18) and to the drain (15) of the bypass FET (14). The RF signal path for the bypass mode in the first impedance matching network (13) is different from the RF signal path for the amplification mode. Accordingly, the RF signal path for the bypass mode may be optimized for impedance matching and loss.

With specific reference to FIG. 7 of the drawings, there is shown an alternate embodiment of a switched amplifying device according to the teachings of the present invention in which there is the amplifying FET (8) and a cascode FET (30) sharing a common bias current in the amplification mode. A source (31) of the cascode FET (30) and the drain (9) of the amplifying FET (8) are interconnected to provide additional amplification without the need for an additional bias voltage. The amplifying FET (8) is switched to the on or off state as discussed above for the first embodiment. In the amplification mode, the cascode FET (30) is turned on by virtue of the series connection of the amplifying FET (8) and the cascode FET (30) and the DC current conducting through the amplifying FET (8) as controlled by the control input (19) and control switch (20). In the bypass mode, the amplifying FET (8) is turned off by turning off control switch (20), thereby opening the source (10) of the amplifying FET (8). With control switch (20) off, the gate (33) of the cascode FET (30) floats to bias potential (100), Vdd, turning the cascode FET (30) on. DC current, however, does not flow through the cascode FET (30) in this mode. The bypass FET (14) is on, by virtue of the control input (19), and RF current conducts through both the bypass FET (14) and the cascode FET (30) without amplification. The cascode configuration has certain advantages including a high output impedance and requiring less injection bias current and using a single bias supply for amplification as compared to a cascade configuration.

Figure 8:
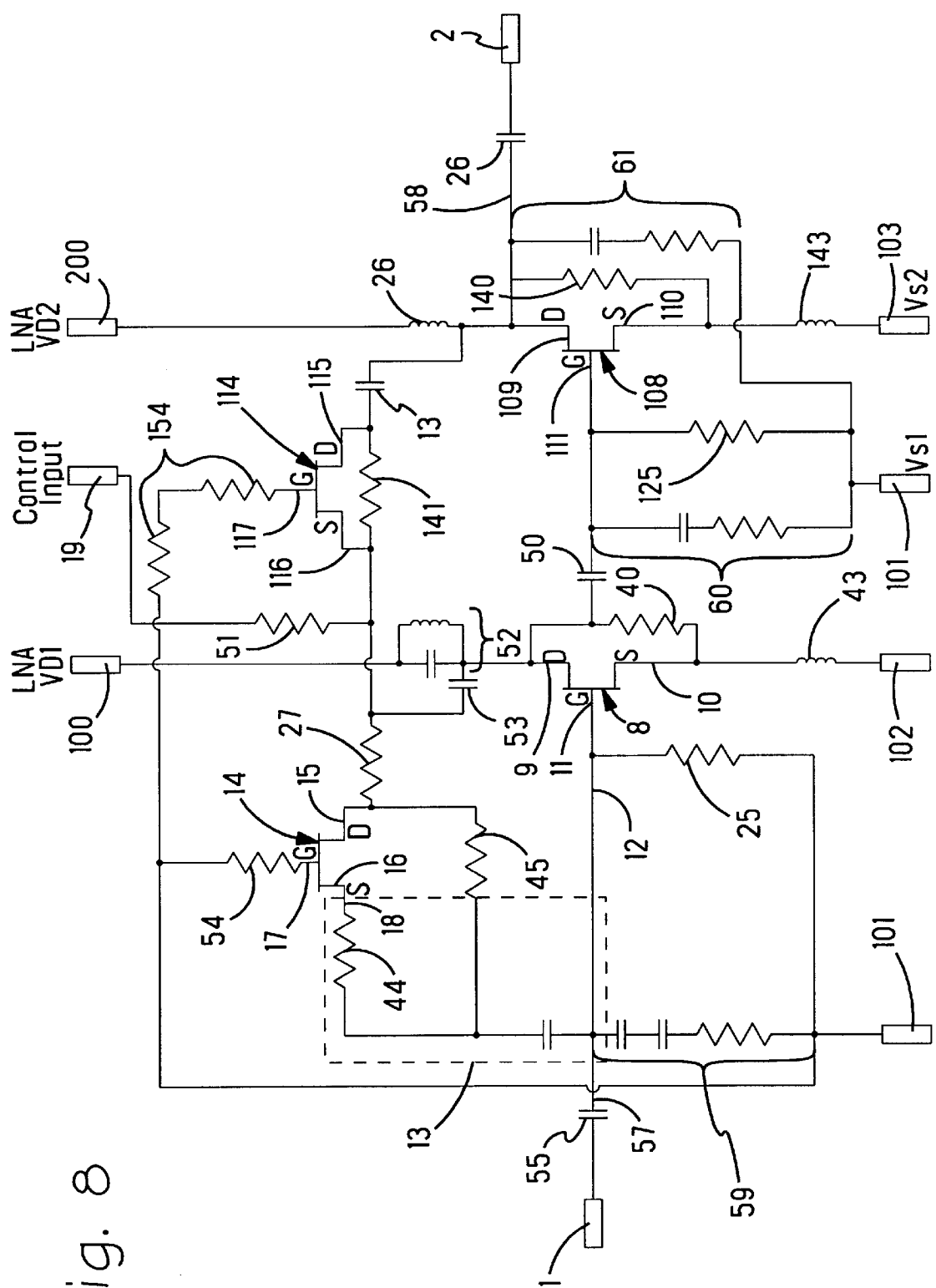
FIG. 8 is a schematic of another alternate embodiment of a switched amplifying device having two amplifiers cascaded according to the teachings of the present invention.

With specific reference to FIG. 8 of the drawings, there is shown a switched amplifying device according to an embodiment of the present invention designed to amplify over a 1.8 GHz to 2 GHz frequency band and having two gain stages in a cascade configuration. Additional gain stages are possible, the circuit configuration of which is within the skill of one of ordinary skill in the art. Two gain stages are shown for simplicity. The dual gain stage embodiment of the switched amplifying device comprises the amplifying FET (8), which in the dual gain stage embodiment is termed a first amplifying FET (8), and a second amplifying FET (108). The first amplifying FET (8) produces an amplified signal at the drain (9). The switched amplifying device further comprises a second amplifying FET having a gate (111) which is coupled to receive and further amplify the amplified signal to achieve higher gain than in the single gain stage embodiment shown in FIG. 4 of the drawings. The drain (9) of the first amplifying FET (8) is connected to the gate (111) of the second amplifying FET (108) through a matching series capacitor (50). *The inductive impedance as shown in FIG. 8 comprises a 3–16 nH inductor electrically in parallel with a 1pF capacitor. The function of the parallel capacitor is to refine the inductive impedance value in the matching network (52). The matching network (50,52) impedance matches the drain (9) of the first amplification FET (8). The gate (11,111) of each amplifying FET (8, 108) is biased to reference potential (101) through respective amplifying FET biasing resistors (25, 125). The drain (9, 109) of each amplifying FET (8, 108) is connected to respective DC biasing potentials at Vd1 (100) and Vd2 (200). The drain (9) of the first amplifying FET (8) is coupled to Vd1 (100) through the matching parallel inductor (52). The source (10,110) of each amplifying FET (8,108) is coupled to first and second gain enable connections (102,103) respectively. The first and second gain enable connections are further connected to external control switches (not shown in FIG. 8 but similar in layout to that shown in FIG. 4) which comprise NPN bipolar junction transistors to open the sources (10,110) of the first and second amplifying FETs(8,108). Control of the gain enable bipolar junction transistors is made by control input (19). The control switch (20) in the embodiment of FIG. 8 is external to the die and connected to the circuit at Vs1 (102) and Vs2 (103) respectively, through first and second amplifying FET source impedance elements (43, 143). In the embodiment of FIG. 8, the first and second amplifying FET source impedance elements (43, 143) are inductors that aid in providing good input return loss and an optimal noise match and have a value of between 1–7 nH depending upon the frequencies of device operation. The switched amplifying device further comprises the bypass FET (14), which in the dual gain stage embodiment is termed a first bypass FET (14), electrically connected in parallel with of the first amplifying FET (8), and a second bypass FET (114) electrically connected in the parallel with the second amplifying FET (108). The first and second bypass FETs (14, 114) are disposed in series with each other. The drain (15) of the first bypass FET (14) and the source (116) of the second bypass FET (114) are connected to each other and to the control input (19) through resistor (51), which in the embodiment of FIG. 8 has a value of 5 kohms. The drain (15) and source (116) are further connected to the drain (9) of the first amplifying FET (8) through DC blocking capacitor (53) having a value of 6 pF. The DC blocking capacitor (53) blocks the DC potential at the control input (19) from reaching the drain (9) of the first amplifying FET (8). The gate (17, 117) of each bypass FET is biased to reference potential (101) through respective bypass FET gate biasing resistors (54, 154) which in the embodiment shown in FIG. 8 have a value of 10 kohms. The first impedance matching network (13) comprises a series capacitor-resistor combination disposed between an RF input DC blocking capacitor (55), having a value of 7 pF for example, and the bypass path output port (18) which is connected to the source (16) of the first bypass FET (14). The series capacitor-resistor combination of the first impedance matching network (13) as shown in FIG. 8 has values of 2 pF and 40 ohms respectively. The series capacitor-resistor combination of the first impedance matching network (13) comprises the RF signal path through first impedance matching network (13) between a DC blocked RF input (57) and the bypass output port (18) for the bypass mode of the switched amplifying device. The embodiment of FIG. 8 further includes first, second and third high frequency stability networks (59–61) each comprising a series capacitor-resistor combination. The first high frequency stability network (59) is connected between DC blocked RF input (57) and reference potential (101) and comprises two series capacitors, each having a value of 0.30 pF, and series resistor having a value of 30 ohms. The second high frequency stability network (60) is connected between the drain (9) of the first amplifying FET (8) and reference potential (101) and comprises a capacitor having a value of 0.40 pF in series with a 40 ohm resistor. The third high frequency stability network (61) is connected between a DC blocked RF output (58) and reference potential (101) and comprises a capacitor having a value of 0.40 pF in series with a resistor having a value of 300 ohms. The high frequency stability networks have a configuration and element impedance values that are optimized for the specific embodiment shown in FIG. 8 and for the specific frequencies of device operation, and may be modified to suit other needs without departing from the scope of the present invention. The purpose of the high frequency networks (59–61) is to suppress undesirable oscillations at frequencies higher than the frequency of operation. The control input (19) is also coupled to the external control switch (not shown) to operate the control switch as well as the first and second bypass switches (14,114).

In operation, the RF signal path of the dual gain stage embodiment shown in FIG. 8 of the drawings in the amplification mode is as follows: control input (19) is at a positive potential Vdd for the amplification mode. The gate (117) of the second bypass FET (114) is pulled to reference potential (101) through second bypass FET gate biasing resistor (154). A Vdd potential at the control input (19) places the source (116) of the second bypass FET (114) at a negative potential relative to the gate (117) of the second bypass FET more negative than a pinchoff voltage of the FET, turning the FET off and preventing current flow from source (116) to drain (115). This inhibits RF current flow from the DC blocked RF in (57) through both of the bypass FETs (14, 114). Bypass FET pull up resistor (141) ensures that bypass FET (114) is off when the amplifying FETs (8, 108) are in the on state. The control input (19) also turns on respective control switches (not shown and external to the IC) connected to respective gain enable points (102, 103) and to the sources (10,110) of the amplifying FETs (8, 108) through respective high frequency stability inductors (43,143). With the control switches in an on state, the sources (10,110) of the amplifying FETs (8,108) are connected to reference potential (101) and current can flow from the drain (9,109) to the source (10,110) of the amplifying FETs (8, 108). A received RF signal is presented at the RF input port (1) where any DC component is blocked by RF input blocking capacitor (55). A DC filtered received RF signal is, therefore, presented at DC blocked RF input (57) and the gate (11) of first amplifying FET (8). A first amplified signal is produced at the drain (9) of the first amplifying FET (8) by virtue of normal operation of the amplifying FET (8) in its on state as described above. The first amplified signal is presented at the gate (111) of the second amplifying FET (108) through matching capacitor (50) having a value of 1.5 pF for example. The second amplifying FET (108) is enabled by the control input (19) and the control switch (not shown) in similar fashion as described for the first amplifying FET (8). The second amplifying FET (108) further amplifies the first amplified signal by virtue of normal FET operation to generate a second amplified signal which is presented at the RF output port (2) through second impedance matching network (26).

In operation, the RF signal path of the dual gain stage embodiment shown in FIG. 8 of the drawings in the bypass mode is as follows: control input (19) is at a reference potential (101) for the bypass mode. The gate (14), source (16), and the drain (15) of the first bypass FET (14) are connected to reference potential (101) through the first bypass FET gate biasing resistor (54) and resistors (44,45, 27,51) and (27,51), respectively. The gate (117) of the second bypass FET (114) is connected to reference potential (101) through the second gate bypass FET biasing resistor (154) and the source (116) and drain (115) of the second bypass FET (114) is connected to reference potential through resistors (51) and (141,51), respectively. When the control input (19) is at reference potential (101), the source (16,116) of the first and second bypass FET (14,114) is at a zero potential relative to the gate (17,117) which is above the pinch-off voltage. The first and second bypass FET (14,114) is, therefore, in an on state and conducts RF current from the drain (15, 115) to the source (16,116). The control input (19) at reference potential (101) also turns the control switches (not shown) off. The sources (10,110) of the amplifying FETs are open circuited and, therefore, do not conduct RF current. The first and second amplifying FET pull up resistors (40,140) having a value of approximately 10 kohms ensure that the amplifying FETs (8, 108) remain in an off state when their sources (10,110) are open. The open sources (10,110) effectively open circuit the amplification FETs (8, 108) and, consequently, the amplification mode of the RF signal path. All RF energy present at the RF input port (1) is directed through the bypass FETs (14,114) to the RF output port (2) without amplification, or with attenuation via some resistive value for attenuation resistor (27) in conjunction with resistor (44) of the first impedance matching network (13).

Figure 9:
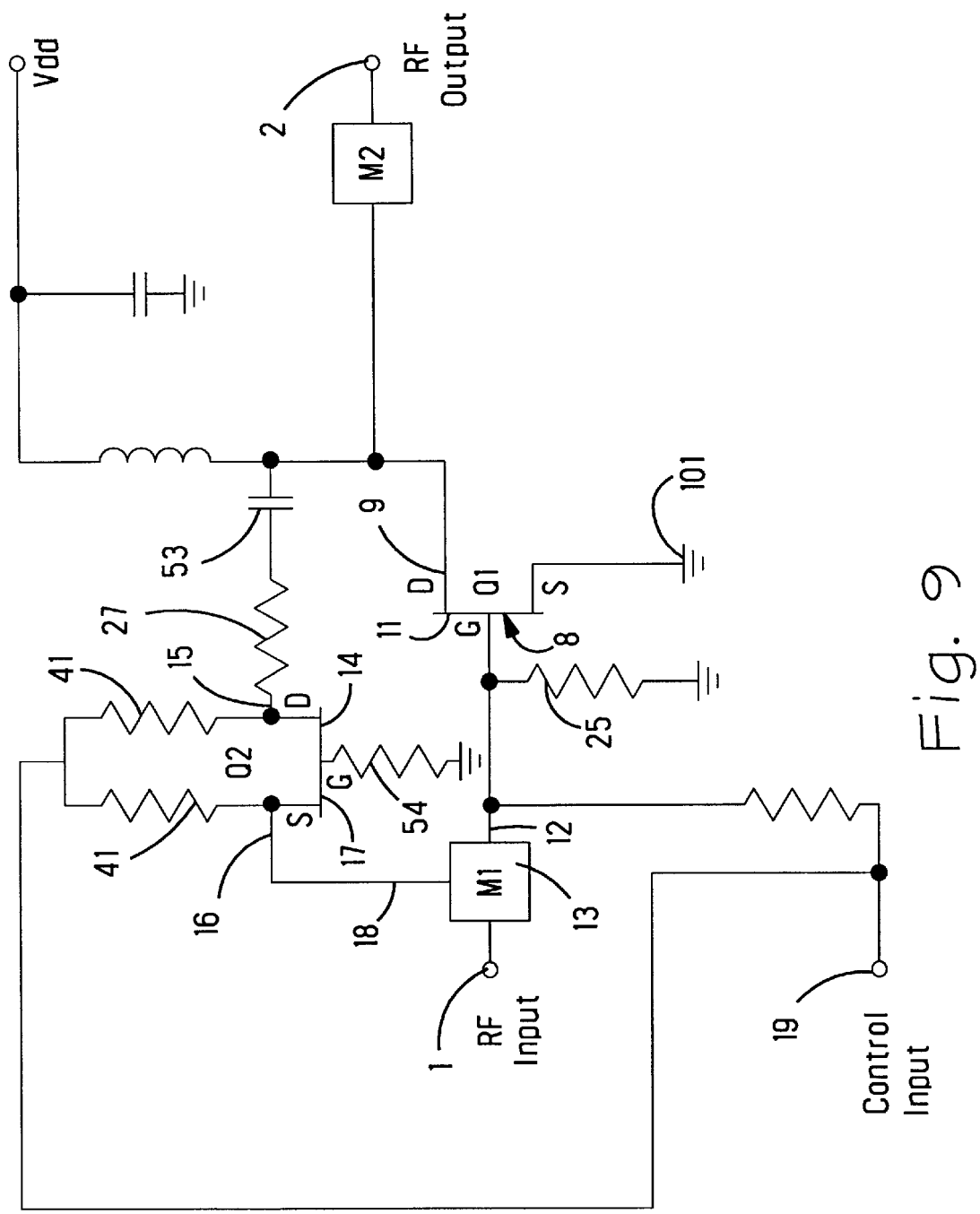
FIG. 9 is a schematic of another alternate embodiment of a switched amplifying device according to the teachings of the present invention employing an enhancement mode GaAs MESFET as an amplifying device.

With specific reference to FIG. 9 of the drawings, there is shown an alternate embodiment of a switched amplifying device according to the teachings of the present invention in which a depletion mode GaAs MESFET is used for a bypass FET (14) and an enhancement mode GaAs MESFET is used for the amplifying FET (8). The gate (11) of the amplifying FET (8) is connected to the control input (19) through a resistor. In this embodiment, the control input (19) voltage at the gate (11) of the amplifying FET (8) directly controls its on and off state. The gate (17) of the bypass FET (14) is pulled to reference potential (101) through the bypass FET gate biasing resistor (54). The control input (19) voltage is also connected to the drain (15) and source (16) of the bypass FET (14) to turn it on and off in opposite polarity to the amplification FET (8). The bypass mode may include some attenuation through the attenuation resistor (27).

Other advantages of the invention are apparent from the detailed description by way of example, and from the accompanying drawings, and from the spirit and scope of the appended claims.

What is claimed is:

1. An amplifying device disposed between an input and an output and having a amplification mode and a bypass mode, the amplifying device comprising:
   an amplifying FET electrically disposed in parallel with a bypass device, said amplifying FET having an on state in the amplification mode and an off state in the bypass mode; and
   a control switch disposed in series with a source of said amplifying FET and having a high impedance state in said bypass mode and having a low impedance state in said amplification mode.

2. An amplifying device as recited in claim 1, said bypass device comprising a bypass FET having an on state in the bypass mode and an off state in the amplification mode.

3. An amplifying device as recited in claim 1, further comprising:
   a control switch having an on state in the amplification mode and an off state in the bypass mode.

4. An amplifying device as recited in claim 1, said amplifying FET comprising a first amplifying FET producing an amplified signal, the amplifying device further comprising a second amplifying FET coupled to receive and further amplify said amplified signal.

5. An amplifying device as recited in claim 1, said bypass device comprising a first bypass switch in said first amplifying FET, the amplifying device further comprising a second bypass switch disposed in parallel with said second amplifying FET.

6. An amplifying device as recited in claim 5, said first and second bypass switches being disposed in series with each other.

7. An amplifying device as recited in claim 1, further comprising:
   a three port input impedance matching network having an input port, an amplification path output port and a bypass path output port, a RF signal path between said input port and said amplification path output port being distinct from a RF signal path between said input port and said bypass path output port.

8. An amplifying device as recited in claim 1, further comprising:
   a bias element connected between a gate of said amplifying FET and a reference potential.

9. An amplifying device as recited in claim 1, comprising an integrated circuit on a single die, said control switch being integral with said integrated circuit.

10. An amplifying device as recited in claim 1, for they comprising an integrated circuit on a single die, said control switch being external to said integrated circuit.

11. An amplifying a device as recited in claim 1, further comprising:
   a boost switch being in parallel with said control switch.

12. An amplifying device as recited in claim 11, said boost switch having a boost input for turning said boost switch on and off.

13. An amplifying device as recited in claim 1, said bypass device further comprising an attenuation element.

14. An amplifying device as recited in claim 13, said attenuation element being in series with said bypass FET.

15. An amplifying device as recited in claim 1, further comprising:
   a bias current setting resistor being in series with a source of the amplifying FET.

16. An amplifying device as recited in claim 15, further comprising:
   a diode being in series with said bias current setting resistor.

17. An amplifying device as recited in claim 1, further comprising:
   a cascode FET having a drain and source, said source of said cascode FET being connected to a drain of a said amplifying FET and said drain of said cascode FET being connected to the output.

18. An amplifying device as recited in claim 1, further comprising:

a cascode FET connected in series with said amplifying FET to share a common bias current in the amplification mode.

19. An amplifying device as recited in claim 18, wherein said cascode FET remains in an on state in the bypass mode.

20. An amplifying device disposed between an input and an output, said amplifying device being operative in an amplification mode to impart gain to an RF signal and in a bypass mode to supply said RF signal to said output without imparting gain thereto, the amplifying device comprising:
   a bypass device;
   an amplifying transistor electrically disposed in parallel with said bypass device, said amplifying transistor having an on state in the amplification mode and an off state in the bypass mode; and
   an impedance matching network, said amplifying transistor being arranged such that said impedance matching network performs impedance matching for said amplifying transistor during an operation of the amplifying device in the amplification mode and said impedance matching network performs impedance matching for said bypass device during an operation of the amplifying device in the bypass mode; and further comprising a control switch disposed in series with a source of said amplifying transistor and having a high impedance state in said bypass mode and having a low impedance state in said amplification mode.

21. An amplifying device as recited in claim 20, wherein said bypass device includes an attenuation element.

22. An amplifying device as recited in claim 21, wherein said attenuation element is in series with said bypass device.

23. An amplifying device as recited in claim 20, wherein said amplifying device further comprises:
   a bias current setting resistor disposed in series with a source of said amplifying transistor.

24. An amplifying device as recited in claim 23, further comprising:
   a temperature compensation element disposed in series with said current setting resistor.

25. An amplifying device as recited in claim 20, further comprising:
   a cascode transistor having a drain and a source, said source of said cascode transistor being connected to a drain of said amplifying transistor and said drain of said cascode transistor being connected to the output.

26. An amplifying device as recited in claim 20, further comprising:
   a cascode transistor being connected in series with said amplifying transistor to share a common bias current in the amplifying mode.

27. An amplifying device as recited in claim 20, wherein said amplifying transistor is an amplifying FET.

28. An amplifying device disposed between an input port for receiving an RF input signal and an output port for supplying one of an amplified and an unamplified RF signal, said amplifying device being operative in an amplification mode to impart gain to an RF signal and in a bypass mode to supply said RF signal to said output port without imparting gain thereto, the amplifying device comprising:
   a bypass device; and
   an amplifying FET electrically disposed in parallel with said bypass device, said amplifying FET having an on state in the amplification mode and an off state in the bypass mode;
   wherein no switches are disposed between said input port and said output port whereby during said bypass mode said amplifying FET is isolated from said input and output ports by changing an impedance state of the amplifying FET; and
   a control switch having an on state in the amplification mode and an off state in the bypass mode.

29. An amplifying device as recited in claim 28, further comprising:
   a three port input impedance matching network having an input port, an amplification path output port and a bypass path output port, a RF signal path between said input port and said amplification path output port being distinct from a RF signal path between said input port and said bypass path output port.

30. An amplifying device as recited in claim 29, further comprising:
   a bias element connected between a gate of said amplifying FET and reference potential.

31. An amplifying device as recited in claim 28, further comprising:
   an integrated circuit on a single die, said control switch being integral with said integrated circuit.

32. An amplifying device as recited in claim 28, further comprising: a boost switch in parallel with said control switch.

33. An amplifying device as recited in claim 32, said boost switch having a boost input for turning said boost switch on and off.

34. An amplifying device disposed between an input port for receiving an RF input signal and an output port for supplying one of an amplified and an unamplified RF signal, said amplifying device being operative in an amplification mode to impart gain to an RF signal and in a bypass mode to supply said RF signal to said output port without imparting gain thereto, the amplifying device comprising:
   a bypass device; and
   an amplifying FET electrically disposed in parallel with said bypass device, said amplifying FET having an on state in the amplification mode and an off state in the bypass mode;
   wherein no switches are disposed between said input port and said output port whereby during said bypass mode said amplifying FET is isolated from said input and output ports by changing an impedance state of the amplifying FET, said amplifying FET comprising a first amplifying FET producing an amplified signal, the amplifying device further comprising a second amplifying FET coupled to receive and further amplify said amplified signal.

35. An amplifying device as recited in claim 34, said bypass device comprising a first bypass switch in said first amplifying FET, the amplifying device further comprising a second bypass switch disposed in parallel with said second amplifying FET.

36. An amplifying device as recited in claim 35, said first and second bypass switches being disposed in series with each other.

37. An amplifying device disposed between an input port for receiving an RF input signal and an output port for supplying one of an amplified and an unamplified RF signal, said amplifying device being operative in an amplification mode to impart gain to an RF signal and in a bypass mode to supply said RF signal to said output port without imparting gain thereto, the amplifying device comprising:
   a bypass device; and
   an amplifying FET electrically disposed in parallel with said bypass device, said amplifying FET having an on state in the amplification mode and an off state in the bypass mode;

wherein no switches are disposed between said input port and said output port whereby during said bypass mode said amplifying FET is isolated from said input and output ports by changing an impedance state of the amplifying FET; and a cascode FET having a drain and a source, said source of said cascode FET being connected to a drain of said amplifying FET and said drain of said cascode FET being connected to the output port.

38. An amplifying device disposed between an input port for receiving an RF input signal and an output port for supplying one of an amplified and an unamplified RF signal, said amplifying device being operative in an amplification mode to impart gain to an RF signal and in a bypass mode to supply said RF signal to said output port without imparting gain thereto, the amplifying device comprising:

a bypass device; and an amplifying FET electrically disposed in parallel with said bypass device, said amplifying FET having an on state in the amplification mode and an off state in the bypass mode;

wherein no switches are disposed between said input port and said output port whereby during said bypass mode said amplifying FET is isolated from said input and output ports by changing an impedance state of the amplifying FET; and a cascode FET being connected in series with said amplifying FET to share a common bias current in the amplifying mode.

39. An amplifying device disposed between an input and an output, said amplifying device being operative in an amplification mode to impart gain to an RF signal and in a bypass mode to supply said RF signal to said output without imparting gain thereto, the amplifying device comprising:

a bypass device;

an amplifying transistor electrically disposed in parallel with said bypass device, said amplifying transistor having an on state in the amplification mode and an off state in the bypass mode;

an impedance matching network, said amplifying transistor being arranged such that said impedance matching network performs impedance matching for said amplifying transistor during an operation of the amplifying device in the amplification mode and said impedance matching network performs impedance matching for said bypass device during an operation of the amplifying device in the bypass mode;

a bias current setting resistor disposed in series with a source of said amplifying transistor; and a temperature compensation element disposed in series with said current setting resistor.

* * * * *